United States Patent

Lee et al.

[11] Patent Number: 5,981,390
[45] Date of Patent: *Nov. 9, 1999

[54] METHOD FOR DEPOSITING A PLATINUM LAYER ON A SILICON WAFER

[75] Inventors: Dong Su Lee; Dong il Chun; Dong Yeon Park; Jo Woong Ha; Eui Joon Yoon; Min Hong Kim; Hyun Jung Woo, all of Seoul, Rep. of Korea

[73] Assignee: Tong Yang Cement Corporation, Seoul, Rep. of Korea

[*] Notice: This patent is subject to a terminal disclaimer.

[21] Appl. No.: 08/914,397

[22] Filed: Aug. 19, 1997

Related U.S. Application Data

[63] Continuation of application No. 08/562,371, Nov. 22, 1995, Pat. No. 5,736,422.

[30] Foreign Application Priority Data

Nov. 26, 1994 [KR] Rep. of Korea ............... P94-31618
Nov. 9, 1995 [KR] Rep. of Korea ............... P95-40450

[51] Int. Cl.$^6$ ................ H01L 21/283; H01L 21/477
[52] U.S. Cl. ............... 438/686; 438/239; 438/650; 438/658; 438/660
[58] Field of Search ............... 438/650, 686, 438/658, 660, 661, 3, 239–256, 381, 386, 393, 396; 257/295

[56] References Cited

U.S. PATENT DOCUMENTS 5,164,808  11/1992  Evans, Jr. et al. ............ 361/305
5,348,894  9/1994   Gnade et al. ................ 437/12
5,440,173  8/1995   Evans, Jr. et al. ............ 257/751
5,453,347  9/1995   Bullington et al. ............ 430/315
5,736,422  4/1998   Lee et al. ................... 438/3

FOREIGN PATENT DOCUMENTS 6-85450  10/1994  Japan.
7-23534  3/1995   Japan.

OTHER PUBLICATIONS

*Oxygen Induced Preferred Orientation of DC Sputtered Platinum*—M. Hecq and A. Hecq, J. Vac. Sci. Technol. 18(2), Mar. 1981, p 219–222.

Primary Examiner—John F. Niebling
Assistant Examiner—Ha Tran Nguyen
Attorney, Agent, or Firm—Oppenheimer Wolff & Donnelly LLP

[57] ABSTRACT

The present invention relates to a method of depositing a platinum thin-film on a silicon wafer. The method includes the steps of depositing a platinum layer on an insulating oxide layer under an oxidation atmosphere to form a mixture film consisted of platinum grains, platinum oxide grains and oxygen adhered to those grains (hereinafter, "the mixture film" to be referred as "oxygen containing platinum thin-film"); depositing an additional platinum thin-film to a desired thickness on the oxygen containing platinum thin-film under a complete inert atmosphere; and annealing the silicon substrate at a temperature of 400 to 1,300° C. in order to remove oxygen present in the independent form or in platinum oxide form within the oxygen containing platinum thin-film and to stabilize the entire platinum thin-film. The oxygen containing platinum thin-film layer serves as a glue layer during the depositing step of additional platinum thin-film layer and is converted into pure platinum condition after the annealing step, whereby the silicon substrate substantially does not have any glue layer between the platinum layer and the insulating layer of the silicon substrate.

28 Claims, 5 Drawing Sheets

BEFORE ANNEALING

AFTER ANNEALING

METHOD FOR DEPOSITING A PLATINUM LAYER ON A SILICON WAFER

This application is a continuation application of U.S. patent application Ser. No. 08/562,371, filed Nov. 22, 1995, now U.S. Pat. No. 5,736,422 which claims priority under the International Convention from Korean Application No. P94-31618 filed Nov. 26, 1994, and Korean Application No. P95-40450 filed Nov. 9, 1995.

BACKGROUND OF THE INVENTION

1. Field of the Invention

The present invention relates to a platinum (Pt) deposition technique for depositing, as electrode material, a platinum thin-film or layer on a silicon wafers generally used in producing oxide thin-film devices or semiconductors, and in particular to a method of forming a platinum thin-film on a silicon wafer substantially without using any glue layer and to a silicon substrate substantially free of any glue layer. Herein, the term "silicon substrate" is used to indicate a silicon wafer, on which a platinum layer is deposited.

2. Description of the Prior Art

Nowadays, the thinning of dielectric, piezo-electric, super-conductive, and magnetic ceramic materials becomes a world-wide tendency in order to meet the requirements of miniaturation, high density integration and functional elevation of electronic ceramic parts or devices. For thinning ceramic materials, single crystal materials such as silicon, MgO, $SrTiO_3$, $LaAlO_3$, and sapphire, and polycrystal materials such as alumina and diamond have been used as a substrate.

Among them, silicon single crystal wafers have been most widely used in conventional semiconductor production processes, since they can be readily adopted to fabricate thin-film devices and circuits through substrate design procedures and are much cheaper as compared with other single crystal wafers or poly-crystal diamond wafers.

When those silicon single crystal wafers are used in producing oxide thin-film devices, it is needed to form electrode layer(s) for either connecting parts within the devices each other or connecting the devices and external circuits, and/or for operating the devices.

Aluminum, copper, platinum, conductive oxide ($RuO_2$), and etc. are used as electrode materials. Aluminum is most widely used as a bottom electrode material in conventional dynamic random access memory (DRAM) devices. For novel devices such as new generation DRAM or ferro-electric random access memory (FRAM) devices, the capacity of which have been raised to 1 G to 4 G bits, however, platinum will be used for the bottom electrode materials when ferro-electric oxide materials of Perovskite structure (BT; $BaTiO_3$, PZT: $PbZr_{1-x}Ti_xO_3$, PLZT: $Pb_{1-x}La_xZr_{1-y}Ti_yO_3$, BST: $Ba_{1-x}Sr_xTiO_3$, etc.) having high dielectric constants or spontaneous polarization characteristics are used as materials for capacitors of those devices instead of conventional $SiO_2/Si_3N_4$ group materials.

Since temperatures for forming the ferro-electric materials are high (700° C.) and exceed the temperature of 500° C., below which temperature aluminum electrodes can be used, platinum electrodes which are thermally and chemically stable are more suitable than aluminum electrodes. Furthermore, it is also possible to obtain thin films having excellent crystallization or orientation if platinum electrodes are used, since nucleation which is very important in a course of forming ferro-electric materials can be initiated more readily on platinum layers than on the other electrode materials.

Examples of well-known methods for depositing platinum thin-film are DC/RF magnetron sputtering, vacuum evaporation, metal organic chemical vapor deposition (MOCVD), and ion plating methods. Among them, the vacuum evaporation method has a disadvantage that the adhesive strength between a silicon wafer and a platinum layer is inferior and the MOCVD method has a disadvantage that impurities such as carbon may be introduced into the platinum layer.

In the DC/RF magnetron sputtering method, if the deposition process is performed under the inert atmosphere as known in the art, hillocks or voids are formed during an annealing process performed after deposition or the other processes such as oxide deposition, since the adhesive strength between the platinum layer and the silicon wafer ($SiO_2/Si$) is not good, and may result in a short of circuit and/or the compositional in homogeneity of oxides on the platinum layer. Furthermore, the interface characteristics between oxide and platinum layers are deteriorated.

In order to solve the above problems, there are generally used methods which interpose a material selected from Ti, Ta, TiN, etc. between a platinum electrode layer and a wafer ($SiO_2/Si$) to serve as a glue layer or methods which do not use platinum but use conductive oxides ($RuO_2$) as electrode materials.

When Ti, Ta or TiN is used as a glue layer, the adhesive strength can be increased at the time of deposition. However, there are serious problems that the surface roughness becomes deterioriated since the materials of glue layer defuse into the platinum layer and react with oxygen, thereby forming oxides ($TiO_2/Ta_2O_3$), that functions of electrodes and/or concections of upper and lower parts may be lost because of the formation of voids and hillocks, and that the adhesive strength is weakened at the end because of the loss of adhesive function due to the oxidation of the metals used as a glue layer.

In addition, if a conductive oxide such as $RuO_2$ is used for an electrode, leakage currents of resultant devices are increased because the electrode surfaces are very rough, and the resistivity of the oxide is higher than that of a platinum-layer. A chemical reaction between the oxide and a ferro-electric oxide thin film may also be caused at the ferro-electric film deposition process performed thereafter.

As noted above, there are many problems in using platinum as electrode material for oxide thin-film devices, but it is the real situation that no solutions for those problems have been reported.

SUMMARY OF THE INVENTION

An object of the present invention is to dissolve the problems of the prior arts related to platinum thin-film formation.

In particular, it is an object of the present invention to provide a silicon substrate having a platinum thin-film substantially free of a glue layer which has been considered as essential in platinum thin-film deposition, wherein the adhesive strengths between the platinum thin-film and an insulating oxide deposited on the silicon wafer are higher than those between a platinum layer and a glue layer interposed between the platinum layer and an insulating oxide formed on a silicon water and wherein neither voids nor hillocks are formed in the platinum thin-film in substantial.

The above objects of the present invention can be achieved by a process established by repeated experiments performed by the inventors. According to repeated experiments, it has been found that it is possible to obtain unexpectedly fantastic results if a platinum thin-film is deposited on a dielectric oxide layer on a silicon wafer through two separate steps, i.e., the first deposition step being performed under an oxidation atmosphere and the second deposition step being performed under an inert atmosphere, and the silicon substrate is annealed in a certain range of temperatures following the second deposition step. In other words, it has been found that it is possible to obtain a silicon substrate having good adhesive characteristics of the platinum thin-film as compared with those obtained using any conventional processes and substantially or completely free of any defects such as voids or hillocks and any other problems of the prior arts caused when the platinum thin-films are deposited via a glue layer or directly on an insulating oxide layer formed on a silicon wafer under an inert atmosphere.

In summary, the platinum thin-film deposition process of the present invention comprises the steps of:

i) providing a silicon wafer;

ii) forming an insulating oxide layer on a surface of the silicon wafer;

iii) depositing a platinum layer on the insulating oxide layer under an oxidation atmosphere to form a mixture film consisted of platinum grains, platinum oxide grains and oxygen adhered to those grains (hereinafter, "the mixture film" to be referred as "oxygen containing platinum thin-film");

iv) depositing an additional platinum thin-film to a desired thickness on the oxygen containing platinum thin-film under a complete inert atmosphere; and v) annealing the silicon substrate at a temperature of 400 to 1,300° C. in order to remove oxygen present in the independent form or in the form of platinum oxide within the oxygen containing platinum thin-film and to stabilize the entire platinum thin-film.

The insulating oxide is $SiO_2$, $Al_2O_3$ or MgO as well-known in the art, and $SiO_2$ is most preferable in view of the fact that it can be formed from simple annealing of a silicon wafer. Since the first platinum deposition step is performed under an oxidation atmosphere according the above process, oxygen is naturally absorbed into platinum thin-film layer and forms "oxygen containing platinum thin-film". Since this film contains oxygen, it has an increased affinity to the insulating oxide therebelow and dow not cause any problems met when platinum layer is deposited on the insulating layer under an inert atmosphere. After this, the deposition of the additional platinum layer on "oxygen containing platinum thin-film" under the inert atmosphere will result in the formation of good and pure platinum thin-film layer to a desired thickness without any problems related to the prior arts as noted in the above due to platinum to platinum combination between the oxygen containing platinum thin-film and the additional platinum thin-film layer. It has been found that substantially all of oxygen present either in the independent form or in the form of platinum oxide in the oxygen containing platinum thin-film is escaped therefrom by annealing the silicon substrate after formation of the second platinum thin-film layer. It appears that this is resulted from the platinum's characteristics of lack of reactivity of affinity with other elements.

As can be understood from the above, the oxygen containing platinum thin-film layer serves as a glue layer during the second depositing step of additional platinum thin-film layer and is converted into pure platinum condition after the annealing step, whereby the silicon substrate produced according to the process of the present invention substantially does not have any glue layer between the platinum layer and the dielectric layer of the silicon substrate. Since the oxygen containing platinum thin-film layer temporarily serves as a glue layer between the pure platinum thin-film layer and the insulating oxide layer, it is sufficient if the oxygen containing platinum thin-film is deposited to cover the dielectric oxide layer. In this regard, thickness of resulting platinum thin-film can be precisely controlled to a desired level at the depositing step of the additional platinum layer under an inert atmosphere.

In addition, according to the inventors' finding, the oxygen containing platinum thin-film can be formed using any conventional technique, for example, DC/RF magnetron sputtering, vacuum evaporation, MOCVD and ion plating methods.

BRIEF DESCRIPTION OF THE DRAWINGS

For more complex understanding of the present invention, the present invention will be explained in detail with reference to the accompanying drawings, in which:

FIGS. 3A to 3C are electron microscope photographs of platinum thin-films formed according to the present invention, in which

DETAILED DESCRIPTION OF THE PREFERRED EMBODIMENTS

The present invention will be more specifically explained with reference to FIGS. 1B and 2B.

Figure 1A:
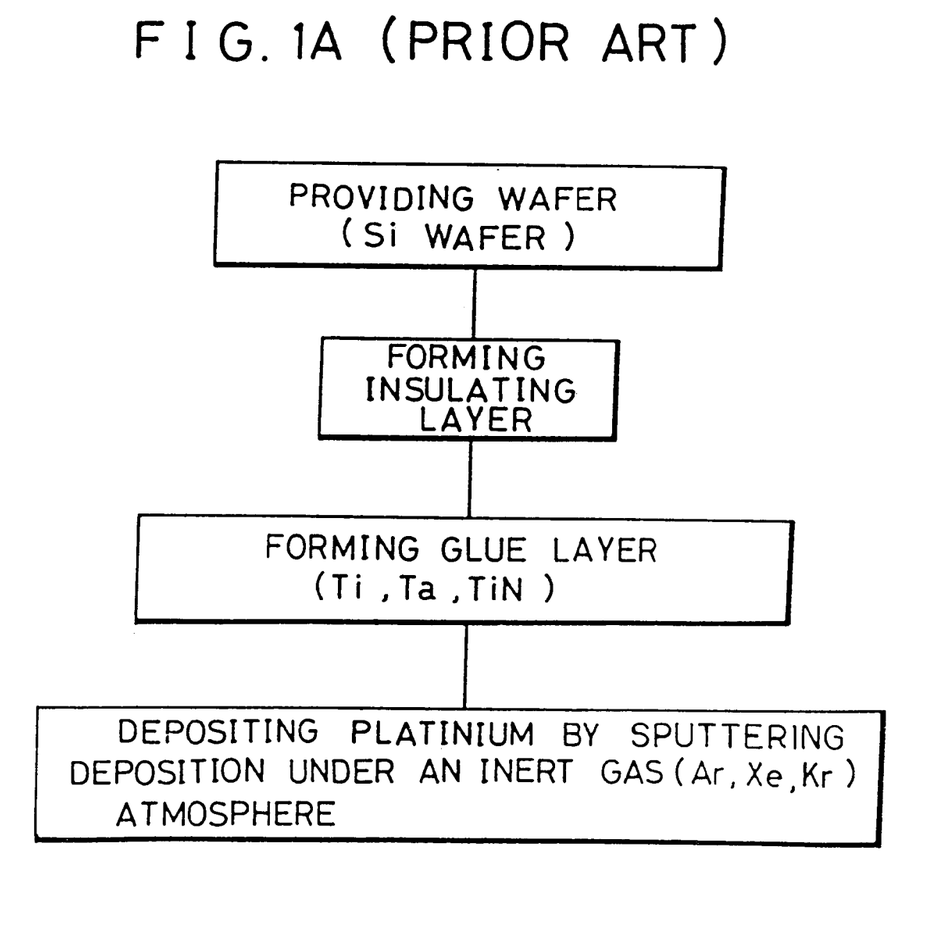
FIG. 1A is a flow chart of a conventional production process using a Ti, Ta or TiN glue layer during the step of sputtering deposition of platinum thin-film layer.
Figure 1B:
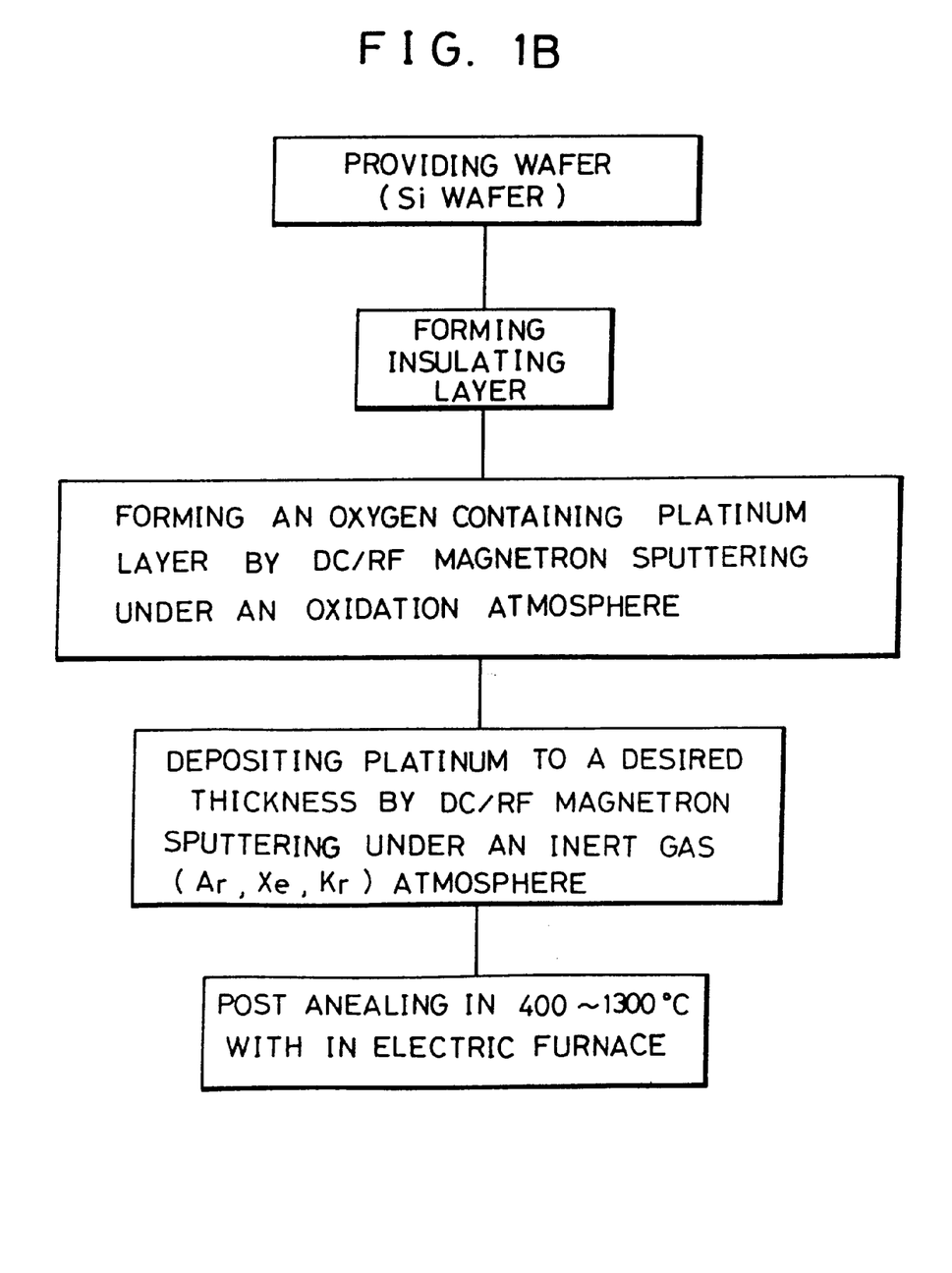
FIG. 1B is a flow chart showing a process according to a preferred embodiment of the present invention.

The step of forming an insulating layer in FIG. 1B is a step of forming an insulating oxide ($SiO_2$) thin-film, alternatively an $Al_2O_3$ or MgO thin film on a silicon wafer. According to the present invention, after the formation of insulating oxide layer, platinum thin-film deposition is performed through two separate steps of different atmospheres. The first deposition step is performed under an atmosphere including oxygen and inert gas (Ar, Kr, Xe), thereby "an oxygen containing platinum thin-film" rather than a pure platinum thin-film being deposited on the insulating oxide layer. In this case, the expression "an atmosphere including oxygen and inert gas" covers the atmosphere containing oxygen in the amount of at least 10% volume and possibly the atmosphere containing pure oxygen only. Oxygen naturally contained within the platinum thin-film layer deposited under such an atmosphere will provide a catalytic action increasing the adhesive strength between the oxygen containing platinum thin-film and the insulating oxide. After the formation of the oxygen containing platinum thin-film, all of the atmosphere gases are extracted and inert gas such as argon is introduced into the atmosphere to create an inert atmosphere. At the second deposition step, an additional pure platinum thin-film is deposited to a thickness needed for electrodes under the inert atmosphere. Following this, the silicon substrate is annealed at a temperature in the range of 400 to 1,300° C. Since platinum of the oxygen containing platinum thin-film and platinum of the additional platinum thin-film are an identical metal, which are no problems related to the adhesive strength, which occurred when platinum was directly deposited on a dielectric layer formed from a material other than platinum. Furthermore, oxygen is removed from the oxygen containing platinum thin-film layer during the annealing step, the oxygen containing platinum thin-film layer is changed to a pure platinum thin-film substantially identical to the additional platinum thin-film and the entire platinum thin-film is stabilized. In this case, the annealing temperature is determined depending on a desired electrode thickness and microstructure thereof.

Figure 2A:
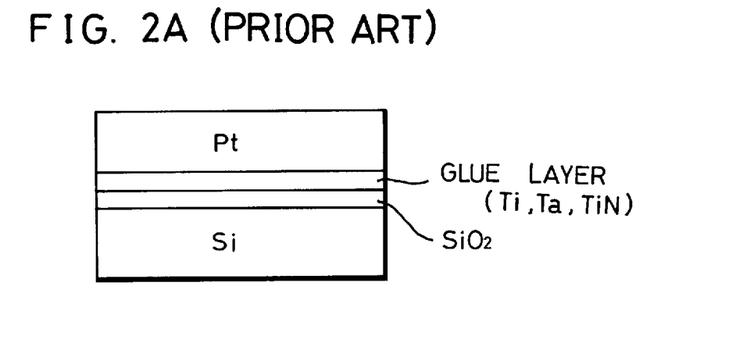
FIG. 2A is a cross-section view of a silicon substrate using a Ti, Ta, or TiN glue layer.
Figure 2B:
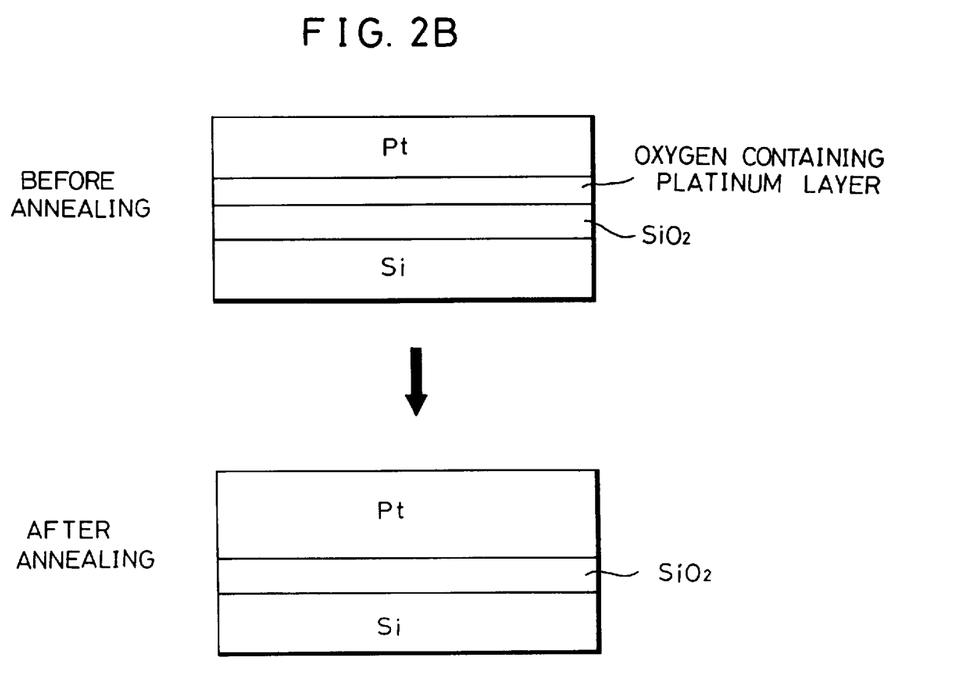
FIG. 2B is a cross-section view of a silicon substrate prepared according to a preferred embodiment of the present invention.
Figure 3A:
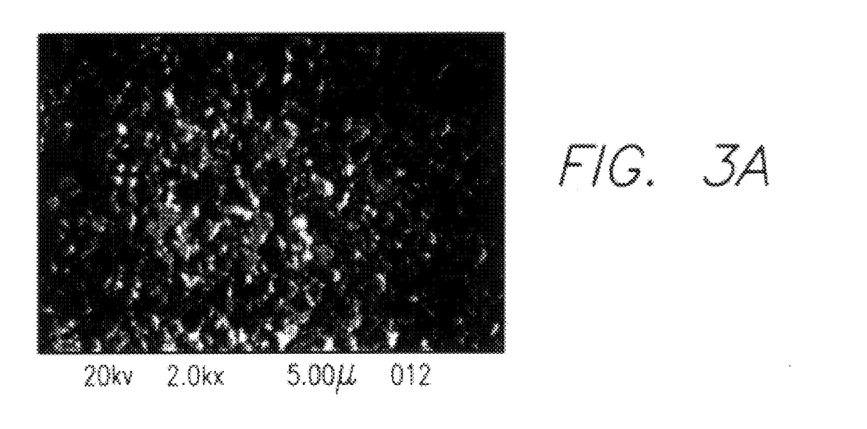
FIG. 3A is 2,000× magnification photograph of the surface of platinum thin-film.
Figure 3B:
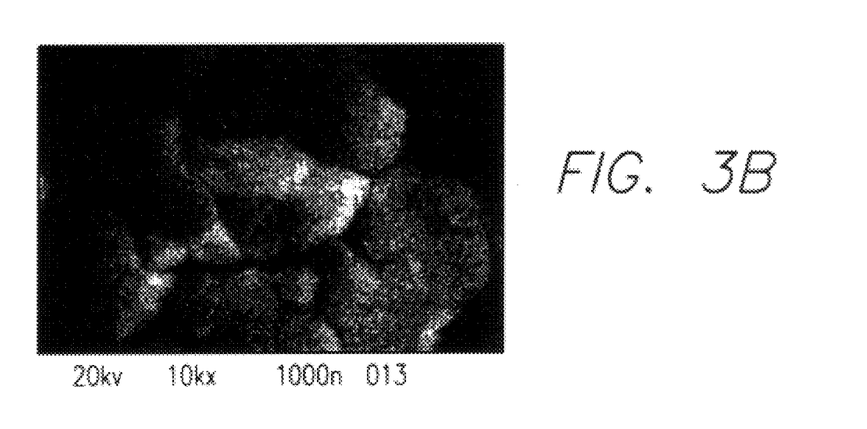
FIG. 3B is similar to FIG. 3A but with 10,000× magnification photograph.
Figure 3C:
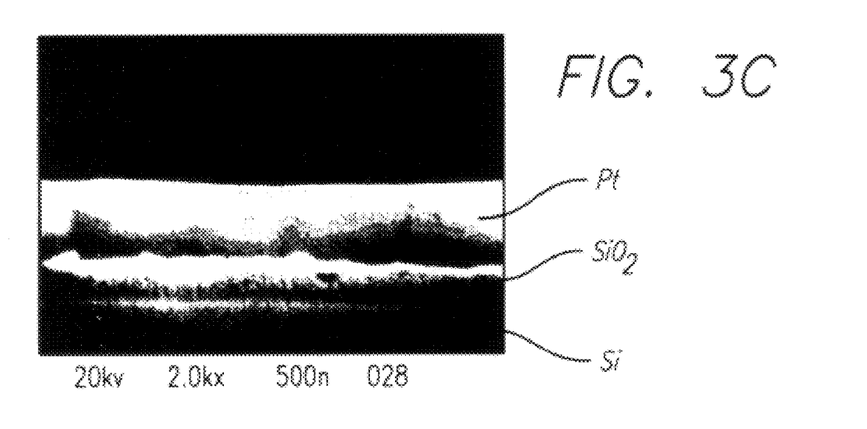
FIG. 3C is 20,000× magnification photograph of a cross-section of platinum thin-film.
Figure 4:
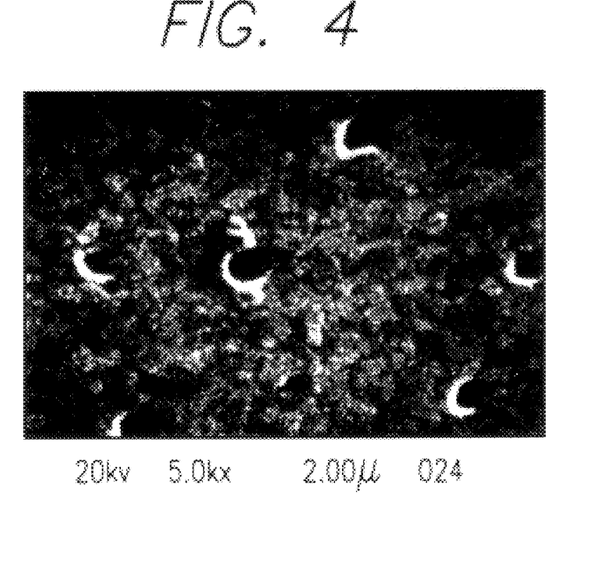
FIG. 4 is an electron microscope photograph showing the microstructure of sample No. 11.
Figure 5:
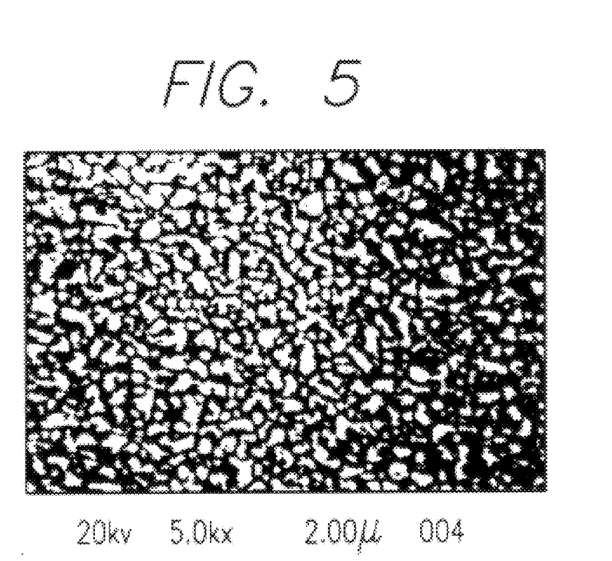
FIG. 5 is an electron microscope photograph showing the microstructure of sample No. 12.

A silicon substrate obtained from the above process is shown in FIG. 2B in a cross-section view and electron microscope photographs thereof are presented in FIGS. 3A to 3C, from which it can be apparently appreciated that the structures are substantially free of glue layers. It has been found that the silicon substrate according to the present invention has outstanding advantages in properties such as the adhesive strength of platinum thin-film and the like. These points will be discussed below in connection with the results of experiments performed by the inventors.

EXAMPLE

Before the deposition step of oxygen containing platinum thin-film, silicon wafers were thermally treated for 3 to 5 hours at 1,200° C. to form a $SiO_2$ layer on silicon wafers.

Although there are many processes for forming silicon oxide ($SiO_2$), e.g., thermal oxidation, annodization, sputtering, chemical vapor deposition, thermal decomposition of silicon compounds, etc., dry oxidation which is one of thermal oxidation processes was used to form silicon oxide.

Using silicon wafers provided with a silicon oxide layer by the above-mentioned process, the first deposition of platinum was performed under the condition as indicated below and an oxygen containing platinum thin-film to temporarily serve as a glue layer was deposited on wafers. (A platinum target with 99.99% purity and of the 4-inch diameter was used and the angle between the target and the silicon wafer was 30°).

Basic pressure: $2 \times 10^{-6}$ Torr
Sputtering pressure: 10 mTorr
Atmosphere: $Ar+O_2$ ($Ar/O_2$ composition ratio: 3/7)
Wafer temperature: room temperature
Revolution velocity of wafer: 5 rpm
Rf power: 150 W
Distance between target and wafer: 13 cm
Deposition time: 1 minute Oxygen and argon gases were introduced into a vacuum chamber to form an oxidation atmosphere and RF power was supplied to platinum target, thereby an oxygen containing platinum rather than pure platinum thin-film being deposited on the wafer due to oxygen contained within the atmosphere and admixed into the first deposited platinum layer. As well known in the art, during the sputtering process, a part of atmospheric gases are ionized and impinged to the platinum target. As a result, platinum atoms are run out and deposited together with oxygen within the oxidation atmosphere on an object being processed, so that "oxygen containing platinum thin-film" partially containing platinum oxide and partially containing oxygen within voids present between platinum grains can be formed on the object.

And, the second layer platinum thin-film was deposited on the oxygen containing platinum thin-film formed as discussed in the above under the following conditions:

Sputtering pressure: 10 m Torr
Atmosphere gas: argon
Wafer temperature: room temperature
Revolution velocity of substrate: 5 rpm
DC power: 200 W
Distance between target and wafer: 13 cm
Diposition thickness: required electrode thickness A difference between the first and second deposition steps in the atmosphere gases used during sputtering. Specifically, at the first deposition, a mixture gases of oxygen and argon was used, while at the second deposition, argon gas was used only. Therefore, at the first deposition, mixed phases of platinum, oxygen admixed to platinum and platinum oxide were formed, while pure platinum thin film was formed at the second deposition.

Thereafter, silicon substrates prepared as explained in the above were annealed at 400 to 1,300° C. in the air using an electric furnace to remove oxygen from the oxygen containing platinum layers which served as a glue layer, and thereby a pure platinum thin-film as shown in FIGS. 3A to 3C was obtained. This annealing may be referred as post-annealing. Annealing temperatures and times can be changed depending on desired electrode thicknesses and microstructure thereof. In the case of silicon wafer, the upper limit of post-annealing temperature was determined to 1,300° C. since its melting point is 1,410° C.

Using platinum thin-films formed in accordance with the process of the present invention, platinum thin-film formed under an inert atmosphere without using a glue layer, and platinum thin-films formed by a process using Ti as a glue layer, resistivities and adhesive strengths of platinum thin-films were measured and the results thereof are indicated in Table 1. Scotch Tape test (STT) which has been generally used as a adhesion power test was also carried out using 3M tape. In measuring resistivities, the 4-point probe method was used and in measuring the adhesive strength, the scratch test method was used.

TABLE 1

| sample No. | deposition atmosphere | post-annealing | resistivity ($\mu\Omega \cdot$ cm) | adhesion strength | STT results | Formation of voids/hillocks. |
|---|---|---|---|---|---|---|
| #1 | $Ar + O_2/Ar$ | 400° C., 2 hr | 15.21 | $\geq 20.7$ | pass | X |
| #2 | $Ar + O_2/Ar$ | 600° C., 2 hr | 12.57 | $\geq 20.9$ | pass | X |

TABLE 1-continued

| sample No. | deposition atmosphere | post-annealing | resistivity (μΩ· cm) | adhesion strength | STT results | Formation of voids/hillocks. |
|---|---|---|---|---|---|---|
| #3 | Ar + O₂/Ar | 700° C., 2 hr | 11.95 | ≧20.7 | pass | X |
| #4 | Ar + O₂/Ar | 900° C., 2 hr | 12.46 | ≧20.9 | pass | X |
| #5 | Ar + O₂/Ar | 900° C., 2 hr | 12.74 | ≧20.9 | pass | X |
| #6 | Ar + O₂/Ar | 1000° C., 2 hr | 13.39 | ≧21.85 | pass | X |
| #7 | Ar + O₂/Ar | 1300° C., 2 hr | 14.12 | ≧23.6 | pass | X |
| Comparative examples | | | | | | |
| #8 | Ar | un-done | 11.78 | 14.44 | fail | O |
| #9 | Ar | un-done | 15.35 | 5.32 | fail | O |
| #10 | Ar | un-done | 0 | 0 | fail | O |
| #11 | Ar | 1000° C., 2 hr | 0 | 5.13 | fail | O |
| #12 | Ar/Ar | 700° C., 1 hr | 19.99 | 0 | pass | O |

Notes.

Ar+O₂/Ar: A part of the platinum layer being deposited under the atmosphere of argon and oxygen mixture and the remainder being deposited under the argon atmosphere to the thickness needed for an electrode.

Ar: platinum layer being deposited under the argon atmosphere to the thickness needed for a electrode.

Ar/Ar: platinum layer being deposited under the argon atmosphere on a Ti layer deposited under the argon atmosphere before platinum layer deposition and used as a glue layer for the platinum layer.

"Pass" indicates that platinum layers were not peeled and "fail" indicates that platinum layers were peeled.

"O" indicates formation of voids and/or hillocks and "X" indicates no formation of voids and hillocks.

Sample Nos. 1 to 7 were obtained from the process of the present invention forming an oxygen containing platinum thin-film to serve as a glue layer and annealing the film at a temperature within the range of 400 to 1,300° C. for 2 hours. Sample No. 8 was obtained by deposition under the inert gas (argon) atmosphere, using a silicon wafer heated to 900° C.; sample No. 9 was obtained by deposition under the inert gas (argon) atmosphere, using a silicon wafer heated to 300° C.; sample No. 10 was obtained by deposition under the inert gas (argon) atmosphere using a silicon wafer, the temperature of which is the normal temperature; and sample No. 11 was obtained using sample No. 10, in which the sample was annealed at 1,000° C. for 2 hours. Sample No. 12 was obtained from a deposition process, in which at first, a Ti thin layer was deposited as a glue layer on a silicon wafer under the inert gas atmosphere, a platinum layer was deposited on the Ti thin layer, and the sample was annealed at 700° C. for 1 hour.

In summary, sample Nos. 1 to 7 have platinum layers deposited by the process of the present invention, sample Nos. 8 to 11 have platinum layers deposited by conventional processes without using glue layers, and sample No. 12 has a platinum layer also formed from a conventional process which includes an annealing step and using a Ti glue layer.

As can be seen from Table 1 and FIGS. 3A to 3C, platinum layers formed from the process of the present invention exhibit superior adhesive strengths as compared with those formed from the other processes, show no voids and hillocks and have uniform grains.

It appears that the adhesive strengths of sample Nos. 8 to 11 formed from conventional processes without using a glue layer can be increased somewhat if the temperatures of wafers at deposition are high or if the deposition process is carried out at the normal temperature and thereafter the substrates are post-annealed. However, the adhesive strengths cannot be increased to the level of those formed from the present invention. Furthermore, if the substrates are post-annealed, voids and/or hillocks appeared during the stress relief and grain growth of platinum layers and therefore the platinum layer become inappropriate to be used for electrodes. (If a ferro-electric oxide film is deposited on a platinum layer having voids, compositional inhomogeneity and short circuits will be caused. For this reason, it is known that it is not possible to post-anneal platinum electrodes until now).

Furthermore, although the known platinum layer deposition process using a Ti glue layer may greatly increase the adhesive strength, the substrates formed from the process is found to have a problem that the Ti layer under the platinum layer is diffused during the post-annealing process and forms hillocks and TiO₂ on the surface of the platinum layer.

The results of the above examples are obtained using platinum layers deposited from the DC/RF magnetron sputtering method. However, the other experiments by the inventors showed that the first platinum layers formed using known vacuum evaporation, MOCVD and ion plating methods can provide substantially same results, especially in adhesive characteristics, only if those processes are carried out under an oxidation atmosphere. Furthermore, although the oxidation atmosphere of the above example contains 3/7 of Ar/O₂ compositional ratio, additional experiments showed that if the oxidation atmosphere contains extremely small quantities of oxygen, i.g. 1/9 of Ar/O₂ compositional ratio or extremely high quantities of oxygen, i.g. 100% oxygen, the effects intended by the present invention can be obtained.

As can be appreciated from the above, if the platinum deposition process is divided into two separate deposition steps and the first step is carried out under an oxidation atmosphere and the second step is carried out under an inert atmosphere, the adhesive strengths of platinum layers can be highly increased but voids and/or hillocks do not appear. Yet, the resistivity values of the platinum layers are substantially same with that of pure platinum.

Of course, it is possible to deposit one or more films such as silicon integrated circuit films, ferro-electric films, magnetic films, piezo-electric films and dielectric films on the platinum layer deposited using the process of the present invention as explained in the above.

Although techniques for depositing platinum layers for electrode materials are explained, it is obvious to those skilled in the art that those platinum layers can be used as electrodes of silicon integrated circuits, ferro-electric, magnetic, piezo-electric, or dielectric thin-film devices, as explained in the beginning of the specification. In addition, it is also possible to form desired circuit devices by depositing one or more films selected among silicon integrated circuit films, ferro-electric films, magnetic films, dielectric films on the platinum layer, and etching those films together with the platinum thin-film layer into a desired circuit pattern. In particular, it is well known in the art that BT (BaTiO$_3$), platinum (PbTiO$_3$), PZT(PbZr$_{1-x}$Ti$_x$O$_3$), PLZT (Pb$_{1-x}$La$_x$Zr$_{1y}$Ti$_y$O$_3$), BST(Ba$_{1-x}$Sr$_x$TiO$_3$), Yl, etc. can be used for ferro-electric or high dielectric films and that the known processes such as photolithography and the like can be used as a etching process.

What is claimed is:

1. A method of forming a platinum layer over an insulating layer in a semiconductor structure for use in an integrated circuit chip, the method comprising the steps of:

depositing a first platinum layer over the insulating layer under an oxygen containing atmosphere to form an oxygen containing platinum layer; and annealing the insulating layer and the oxygen containing platinum layer to remove oxygen present in the oxygen containing platinum layer.

2. The method according to claim 1 wherein the step of depositing includes depositing the first platinum layer directly over the insulating layer without a glue layer therebetween.

3. The method according to claim 1, after the step of depositing a first platinum layer, further comprising the step of depositing a second platinum layer over the oxygen containing platinum layer under an oxygen free inert atmosphere; and wherein the annealing step includes annealing the insulating layer, the oxygen containing platinum layer and the second platinum layer, the two platinum layers forming a single platinum layer due to annealing.

4. The method according to claim 3 wherein the insulating layer includes a ferro-electric insulating layer such that the annealed platinum layer forms one electrode of a ferro-electric capacitor.

5. The method according to claim 3 wherein the forming step includes the step of forming an oxide layer over a surface of the semiconductor substrate.

6. The method according to claim 1 wherein the forming step includes the step of depositing a ferro-electric insulating layer such that the annealed platinum layer forms one electrode of a ferro-electric capacitor.

7. The method according to claim 1 wherein the forming step includes the step of forming an oxide layer over a surface of the semiconductor substrate.

8. The method according to claim 1 wherein the insulating layer comprises one of SiO$_2$, Al$_2$O$_3$, MgO and BPSG.

9. The method according to claim 1 wherein the depositing step is performed with either oxygen without an inert gas or oxygen with at least one inert gas.

10. The method according to claim 1 wherein the depositing step includes depositing by either DC/RF sputtering, vacuum evaporation, chemical vapor deposition or ion plating.

11. A method of forming a platinum layer over an insulating layer in a semiconductor structure for use as an electrode in an integrated circuit chip, the method comprising the steps of:

forming an insulating layer in a semiconductor structure;

depositing a first platinum layer over the insulating layer under an oxygen containing atmosphere to form an oxygen containing platinum layer; and annealing the insulating layer and the oxygen containing platinum layer under a temperature range of 400 to 1300 degrees Celsius, the annealing step removing oxygen present in the oxygen containing platinum layer to form an oxygen free platinum layer.

12. The method according to claim 1 wherein the step of depositing includes depositing the first platinum layer directly over the insulating layer without a glue layer therebetween.

13. The method according to claim 11, after the step of depositing a first platinum layer, further comprising the step of depositing a second platinum layer over the oxygen containing platinum layer under an oxygen free inert atmosphere; and wherein the annealing step includes annealing the insulating layer, the oxygen containing platinum layer and the second platinum layer, the two platinum layers forming a single platinum layer due to annealing.

14. The method according to claim 13 wherein the insulating layer includes a ferro-electric insulating layer such that the annealed platinum layer forms one electrode of a ferro-electric capacitor.

15. The method according to claim 13 wherein the forming step includes the step of forming an oxide layer over a surface of the semiconductor substrate.

16. The method according to claim 11 wherein the forming step includes the step of depositing a ferro-electric insulating layer such that the annealed platinum layer forms one electrode of a ferro-electric capacitor.

17. The method according to claim 11 wherein the forming step includes the step of forming an oxide layer over a surface of the semiconductor substrate.

18. The method according to claim 11 wherein the insulating layer comprises one of SiO$_2$, Al$_2$O$_3$ and MgO.

19. The method according to claim 11 wherein the depositing step is performed with either oxygen without an inert gas or oxygen with at least one inert gas.

20. The method according to claim 11 wherein the depositing step includes depositing by either DC/RF sputtering, vacuum evaporation, chemical vapor deposition or ion plating.

21. The method according to claim 11 wherein the forming step includes the step of depositing a ferro-electric oxide material of Perovskite structure such that the annealed platinum layer forms one electrode of a ferro-electric capacitor.

22. The method according to claim 11 wherein the ferro-electric oxide material is one of BT(BaTiO$_3$), PT(PbTiO$_3$), PZT(PbZr$_{1-x}$Ti$_x$O$_3$), PLZT(Pb$_{1-x}$La$_x$Zr$_{1-y}$Ti$_y$O$_3$), PLT (Pb$_{1-x}$La$_x$TiO$_3$) and Yl.

23. A method of forming a platinum layer over an insulating layer in a semiconductor structure for use as an electrode in an integrated circuit chip, the method comprising the steps of:

forming an insulating layer in a semiconductor structure;

depositing a first platinum layer over the insulating layer under an oxygen containing atmosphere to form an oxygen containing platinum layer;

depositing a second platinum layer over the oxygen containing platinum layer under an oxygen free inert atmosphere; and annealing the semiconductor structure under a temperature range of 400 and 1300 degrees Celsius such that the two platinum layers form a single oxygen free platinum layer.

24. The method according to claim 23 wherein the insulating layer includes a ferro-electric insulating layer such that the single platinum layer forms one electrode of a ferro-electric capacitor.

25. The method according to claim 23 wherein the forming step includes the step of forming an oxide layer over a surface of the semiconductor substrate.

26. A method of forming a platinum layer over an insulating layer for use in a ferro-electric memory device, the method comprising the steps of:

forming an insulating layer over a substrate;

depositing a first platinum layer over the insulating layer under an oxygen containing atmosphere to form an oxygen containing platinum layer; and annealing the substrate under a temperature range of 400 and 1300 degrees Celsius to remove oxygen present in the oxygen containing platinum layer, wherein the annealed platinum layer forms one electrode of a ferro-electric capacitor.

27. The method according to claim 26 wherein the forming step includes forming a ferro-electric dielectric layer over an electrode of a ferro-electric capacitor.

28. The method according to claim 27 wherein the forming step includes forming an oxide layer, the method further comprising, after the annealing step, forming a ferro-electric dielectric layer over the one electrode of the ferro-electric capacitor.

* * * * *